United States Patent [19]

Kreuz et al.

[11] Patent Number: 5,175,240
[45] Date of Patent: Dec. 29, 1992

[54] AROMATIC HOMOPOLYIMIDE OR COPOLYIMIDE FILMS HAVING LOW WATER ABSORPTION AND HIGH THERMAL DURABILITY

[75] Inventors: John A. Kreuz, Columbus; Stuart N. Milligan, Circleville, both of Ohio

[73] Assignee: E.I. Du Pont de Nemours and Company, Wilmington, Del.

[21] Appl. No.: 628,234

[22] Filed: Dec. 17, 1990

[51] Int. Cl.$^5$ .................. C08G 69/26; C08G 8/02
[52] U.S. Cl. ...................... 528/353; 528/125; 528/128; 528/170; 528/172; 528/173; 528/174; 528/176; 528/183; 528/185; 528/188; 528/220; 528/229; 528/350; 428/473.5
[58] Field of Search ............... 528/353, 125, 128, 170, 528/172, 173, 174, 183, 188, 350, 220, 229, 176, 185, 187; 428/473.5

[56] References Cited

U.S. PATENT DOCUMENTS

| | | | |
|---|---|---|---|
| 4,290,936 | 9/1981 | Sasaki et al. | 528/183 |
| 4,358,581 | 11/1982 | Sutton, Jr. | 528/353 |
| 4,426,486 | 1/1984 | Hungerford | 528/353 |
| 4,487,911 | 12/1984 | Lange et al. | 528/125 |
| 4,530,993 | 7/1985 | Jinda et al. | 528/353 |
| 4,629,777 | 12/1986 | Pfeifer | 528/352 |
| 4,687,836 | 8/1987 | Ibi et al. | 528/353 |
| 4,690,999 | 9/1987 | Numata et al. | 528/188 |
| 4,725,484 | 2/1988 | Kumagawa et al. | 528/353 |
| 4,778,872 | 10/1988 | Sasaki et al. | 528/176 |
| 4,880,699 | 11/1989 | Kohn | 528/229 |
| 4,886,874 | 12/1989 | Nagano et al. | 528/353 |
| 4,977,230 | 12/1990 | Nozawa et al. | 528/125 |
| 5,071,997 | 12/1991 | Harris | 528/220 |

FOREIGN PATENT DOCUMENTS

| | | |
|---|---|---|
| 0133533 | 2/1985 | European Pat. Off. |
| 61-099132 | 6/1985 | Japan |
| 60-218071 | 10/1985 | Japan |
| 61-188127 | 8/1986 | Japan |
| 63-165515 | 7/1988 | Japan |
| 63-215724 | 9/1988 | Japan |

*Primary Examiner*—John Kight, III
*Assistant Examiner*—P. Hampton-Hightower

[57] ABSTRACT

Aromatic homopolyimide and copolyimide films derived from an aromatic dianhydride and a chlorinated aromatic diamine such as 2-chloro-p-phenylene diamine and 2,2'-dichloro-4,4'-diaminodiphenyl ether are described. The films have low water absorption, high elastic modulus and elongation and can be heat-processed without embrittlement.

13 Claims, No Drawings

AROMATIC HOMOPOLYIMIDE OR COPOLYIMIDE FILMS HAVING LOW WATER ABSORPTION AND HIGH THERMAL DURABILITY

BACKGROUND OF THE INVENTION

This invention relates to aromatic homopolyimide and copolyimide films derived from an aromatic dianhydride and a chlorinated aromatic diamine having low water absorption, high elastic modulus and elongation and which can be heat-processed without deleterious decomposition.

Aromatic polyimides and copolyimides are well-known in the art to have outstanding heat resistance and tensile properties making them commercially useful as molded products such as films or fibers. However, the water absorption of such polyimide films is undesirably quite high. High water absorption affects deleteriously the dimensional and the thermal stability of the film, reduces mechanical property values and limits fabrication latitude. Furthermore, the introduction of stiff copolymer segments into the polyimide polymer chain causes the polymer film to become rigid and disadvantageously brittle during heat-processing.

It has now been found that the introduction of specific chlorinated aromatic diamines into the aromatic (co)polyimides provides films having water absorptions considerably lower than the corresponding non-chlorinated (co)polyimide films. Furthermore, when preparing the (co)polyimide films by a chemical conversion process using an anhydride dehydrating agent and a tertiary amine catalyst, the intermediate films are very flexible and can be advantageously heat-processed without embrittlement. Quite surprisingly, the chlorinated (co)polyimides also provide films having a much higher elastic modulus and elasticity than the corresponding non-chlorinated (co)polyimide films making useful as base films for magnetic recording tapes and as substrates for flexible printed circuits and tape-automated bonding.

U.S. Pat. No. 4,530,993, issued to Jinda et al. on Jul. 23, 1985, discloses a polyimide film derived from pyromellitic dianhydride and 2,2'-dichlorobenzidine having a high tensile strength and elastic modulus and a high heat resistance. The invention (co)polyimide films do not contain 2,2'-dichlorobenzidine as a component.

Japanese patent publication 62-79227, published on Apr. 11, 1987, discloses aromatic copolyimide films derived from pyromellitic dianhydride and mixtures of 2,2'-dichlorobenzidine with benzidine, 3,3'-dimethylbenzidine and 2-chlorobenzidine having good mechanical properties and high heat resistance. The invention (co)polyimide films do not contain dichlorobenzidine and dimethylbenzidine as diamine components.

U.S. Pat. No. 4,690,999, issued to Numata et al. on Sep. 1, 1987, discloses a polyimide having a low thermal expansion coefficient comprising at least one aromatic ring as a structural component which can rotate around its molecular axis but has no flexibility in another direction and which is oriented in at least a uniaxial direction. The polyimides are derived from various aromatic dianhydrides and aromatic diamines with the imide rings bonded to the aromatic phenyl rings at the para-positions to provide rigid, crystallized structures. There is no specific disclosure, however, of using chlorinated aromatic diamines as a component in these rigid structures.

SUMMARY OF THE INVENTION

This invention provides an aromatic homo- or copolyimide film having low water absorption and high thermal durability comprising an aromatic tetracarboxylic dianhydride component and an aromatic diamine component herein said aromatic diamine component comprises from 30 to 100 mole %, based on the total molar amount of said diamine component, of a chlorinated aromatic diamine selected from the group consisting of 2-chloro-p-phenylene diamine and 2,2'-dichloro-4,4'-diaminodiphenylether.

DETAILED DESCRIPTION OF THE INVENTION

The homopolyimides and copolyimides of the invention are prepared by reaction of an aromatic tetracarboxylic dianhydride with an aromatic diamine wherein the aromatic diamine comprises from 30 to 100 mole %, based on the total molar amount of the diamine component, of a chlorinated aromatic diamine such as 2-chloro-p-phenylene diamine and 2,2'-dichloro-4,4'-diaminodiphenylether.

The polyimides are generally prepared as described in U.S. Pat. No. 3,179,630 and U.S. Pat. No. 3,179,634, the disclosures of which are incorporated herein by reference.

Accordingly, the aromatic polyamide acids can be prepared by block or random polymerization of substantially equimolar amounts of the aromatic tetracarboxylic dianhydride and aromatic diamine components at a polymerization temperature not higher than 175° C., preferably not higher than 90° C., for about one minute to several days in an inert organic solvent. The aromatic dianhydride and diamine components can be added either neat, as a mixture or as solutions to the organic solvent or the organic solvent may be added to the components.

The organic solvent may dissolve one or all of the polymerizing components and, preferably, will dissolve the polyamide acid polymerization product. The solvent must, of course, be substantially unreactive with all of the polymerizing components and with the polyamide acid polymerization product.

Preferred solvents include normally liquid N,N-dialkylcarboxylamides, generally. Especially preferred solvents include the lower molecular weight members of such carboxylamides, particularly N,N-dimethylformamide and N,N-dimethylacetamide. Other useful compounds of this class of solvents are N,N-diethylformamide and N,N-diethylactamide. Other solvents which may be used are dimethylsulfoxide, N-methyl-2-pyrrolidone, N-cyclohexyl-2-pyrrolidone, tetramethyl urea, dimethylsulfone, hexamethylphosphoramide, tetramethylenesulfone, diglyme, pyridine and the like. The solvents can be used alone, in combinations with one another or in combinations with poor solvents such as benzene, benzonitrile, dioxane, etc. The amount of solvent used preferably ranges from 75 to 90 weight % of the polyamide acid solution, since this concentration has been found to give optimum molecular weight.

It is not required that the aromatic tetracarboxylic dianhydride and diamine components be used in absolutely equimolar amounts. In order to adjust the molecular weight, the molar ratio of aromatic tetracarboxylic dianhydride component to aromatic diamine component can range from 0.90 to 1.10.

The aromatic polyamide acid solution prepared as described above contains from 5 to 40 weight %, preferably 10 to 25 weight %, of polyamide acid polymer.

Suitable aromatic tetracarboxylic dianhydrides for use in the invention include: pyromellitic dianhydride; 2,3,6,7-naphthalene tetracarboxylic dianhydride; 3,3',4,4'-biphenyl tetracarboxylic dianhydride; 1,2,5,6-naphthalene tetracarboxylic dianhydride; 2,2',3,3'-biphenyl tetracarboxylic dianhydride; 3,3',4,4'-benzophenone tetracarboxylic dianhydride; 2,2-bis(3,4-dicarboxyphenyl) propane dianhydride; bis(3,4-dicarboxyphenyl) sulfone dianhydride; 3,4,9,10-perylene tetracarboxylic dianhydride; bis(3,4-dicarboxyphenyl) propane dianhydride; 1,1-bis(2,3-dicarboxyphenyl) ethane dianhydride; 1,1-bis(3,4-dicarboxyphenyl) ethane dianhydride; bis(2,3-dicarboxyphenyl) methane dianhydride; bis(3,4-dicarboxyphenyl) methane dianhydride; oxydiphthalic dianhydride; bis(3,4-dicarboxyphenyl) sulfone dianhydride; and the like.

Homopolyimides derived from either pyromellitic dianhydride (PMDA) or 3,3',4,4'-biphenyltetracarboxylic dianhydride (BPDA) as the aromatic dianhydride component and 2-chloro-p-phenylene diamine (ClPPD) or 2,2'-dichloro-4,4'-diaminodiphenyl ether (DClODA) as the aromatic diamine component are particularly preferred herein.

Copolyimides derived from one or more of the aforementioned aromatic tetracarboxylic dianhydrides together with ClPPD or DClODA and an additional aromatic diamine monomer are also encompassed by the invention.

Suitable additional aromatic diamines include: 4,4'-diaminodiphenyl propane; 4,4'-diamino diphenyl methane; benzidine; 4,4'-dichlorobenzidine; 4,4'-diamino diphenyl sulfide; 3,3'-diamino diphenyl sulfone; 4,4'-diamino diphenyl sulfone; 4,4'-diamino-diphenyl ether; 1,5-diamino naphthalene; 4,4'-diamino-diphenyl diethylsilane; 4,4'-diamino diphenylsilane; 4,4'-diamino diphenyl ethyl phosphine oxide; 4,4'-diamino diphenyl N-methyl amine; 4,4'-diamino diphenyl-N-phenyl amine; 1,4-diaminobenzene (p-phenylenediamine); 1,3-diaminobenzene; 1,2-diaminobenzene; and the like.

Preferred copolyimides of the invention include those containing based on the amine component from 30 to 70 mole % of 2-chloro-p-phenylene diamine or 2,2'-dichloro-4,4'-diaminodiphenylether, from 30 to 70 mole % of 4,4'-diaminodiphenylether and based on the dianhydride from 25 to 75 mole % of at least one aromatic tetracarboxylic dianhydride selected from pyromellitic dianhydride, 3,3',4,4'-biphenyltetracarboxylic dianhydride and 3,3',4,4'-benzophenone copolyimides of the invention contain between 40% and 50 mole % of either 3,3',4,4'-benzophenone tetracarboxylic dianhydride or 3,3',4,4'-biphenyltetracarboxylic dianhydride and between 50% and 70 mole % of a chlorinated aromatic diamine, such as 2-chloro-p-phenylene diamine.

The aromatic polyamide acid is subsequently converted to polyimide by a chemical conversion process wherein the polyamide acid solution is either immersed in or mixed with conversion chemicals. The polyamide acid conversion chemicals are tertiary amine catalysts and anhydride dehydrating materials. The preferred anhydride dehydrating material is acetic anhydride and is often used in slight molar excess of the amount of amide acid groups in the polyamide acid, typically about 2-2.4 moles per equivalent of polyamide acid. A comparable amount of tertiary amine catalyst is often used.

Besides acetic anhydride, other operable lower fatty acid anhydrides include propionic, butyric, valeric, mixed anhydrides of these with one another and with anhydrides of aromatic monocarboxylic acids, for example, bnezoic acid, naphthoic acid, and the like, and with anhydrides of carbonic acid and formic acids, as well as aliphatic ketenes (ketene and dimethyl ketene). Ketenes may be regarded as anhydrides of carboxylic acids derived from drastic dehydration of the acids.

The preferred tertiary amine catalysts are pyridine and beta-picoline and they are used in varying amounts from zero to several moles per mole of anhydride dehydrating material. Tertiary amines having approximately the same activity as the preferred pyridine and beta-picoline may also be used. These include alpha-picoline; 3,4-lutidine; 3,5-lutidine; 4-methyl pyridine; 4-isopropyl pyridine; N,N-dimethylbenzyl amine; isoquinoline; 4-benzyl pyridine, N,N-dimethyldodecyl amine and triethyl amine. Trimethyl amine is more active than those amines listed above and can be used in smaller amounts.

The polyamide acid conversion chemicals react at about room temperature or above to convert the polyamide acid to the polyimide. The chemical conversion reaction preferably occurs at temperatures from 15 to 120° C., with the reaction being very rapid at the higher temperatures and very slow at the lower temperatures.

The chemically treated polyamide acid solution is cast or extruded onto a heated conversion surface whereupon some of the solvent is evaporated from the solution, the polyamide acid is partially chemically converted to polyimide, and the solution takes the form of a polyamide acid-polyimide gel. Alternately, the polyamide acid solution can be extruded into a bath of conversion chemicals consisting of an anhydride component and a tertiary amine component with or without a diluting solvent. Conversion of amide acid groups to imide groups depends on contact time and temperature but is usually about 25 to 75% complete. The gel is self-supporting in spite of its high solvent content.

The gel may be additionally treated by extraction, coating, or some other means. It is then subsequently dried to remove the water, residual solvent, and remaining conversion chemicals, and the polyamide acid is completely converted to polyimide. The drying can be conducted at relatively mild conditions without complete conversion of polyamide acid to polyimide at that time, or the drying and conversion can be conducted at the same time using higher temperatures. Because the gel has so much liquid which must be removed during the drying and converting steps, the gel must be restrained during drying to avoid undesired shrinkage. In continuous production, the film can be held at the edges, such as in a tenter frame using tenter clips or pins for restraint.

Preferably, high temperatures are used for short times to dry the film and convert it to polyimide in the same step. It is preferred to heat the film to a temperature of 200-500° C. for at least one second. Of course, less heat and time are required for thin films than for thicker films. During this drying and converting, the film is retrained from undue shrinking and, in fact, can be stretched by as much as 200 percent of its initial dimension prior to completion of the drying and conversion. Stretching can be in any dimension. In film manufacture, stretching can be in either the longitudinal direction or the transverse direction. If desired, restraint can also be provided to permit some limited degree of shrinkage.

The homopolyimide and copolyimide films of the invention containing a chlorinated aromatic diamine as a monomer component and prepared by a chemical conversion process have a unique combination of properties including a high modulus of elasticity of from about 500 to 1200 Kpsi, an elongation of from about 5 to 90%, a water absorption of less than 3.50% and can be heat-cured without harmful decomposition.

The homo- and copolyimide films containing the chlorinated diamine components have significantly lower moisture absorption than the corresponding homo- and copolyimide films without the chlorinated aromatic diamine components (see Examples 1 to 4 and Comparative Examples 1C to 4C). Low moisture containing polyimide films are very desirable for use in the manufacture of copper clads in order to prevent blistering in solder baths.

The chlorine containing polyimides are particularly advantageous since they are much easier to process during chemical conversion due to fewer film breaks occurring during heat-curing of the film. The increased elongation at a given modulus is also beneficial since it increases flex life of the film and permits the use of thinner sheets of film while maintaining adequate film stiffness for processing.

Specific applications for the polyimide films of the invention include tape automated bonding, as a base film for magnetic recording tape or a FPC board, heatresistant insulation, and semiconductors, and a coverlay or covercoat for flexible and rigid printed circuits.

The advantageous properties of this invention can be observed by reference to the following examples which illustrate, but do not limit, the invention. All parts and percentages are by weight unless otherwise indicated.

EXAMPLES 1 TO 10 (COMPARATIVE EXAMPLES 1C TO 4C)

These examples illustrate the preparation of homopolyimide and copolyimide films of the invention containing 2-chloro-p-phenylene diamine and 2,2'-dichloro-4,4'-diaminodiphenylether as a diamine component having lower water absorption and higher modulus and elongation than the corresponding polyimide films not containing the chlorinated aromatic diamine components.

Polyamide acids were prepared by dissolving the ClPPD, DClODA, ODA and PPD aromatic diamines in the molar amounts specified in Table I in dimethylacetamide (DMAC) solvent. The aromatic tetracarboxylic dianhydrides (PMDA, BPDA and BTDA) were subsequently added in the specified molar amounts while stirring at ambient temperature. In some cases a 6% solution of PMDA in DMAC was added to provide polyamide acid polymer solutions having approximately 100% molar stoichiometry of the monomers specified in Table I and inherent viscosities ranging from 1.00 to 2.00.

The polyamide acids were chemically converted into polyimide films by casting the polyamide acid solutions onto glass plates and then immersing the cast films in a 50:50 by volume mixture of acetic anhydride and beta-picoline until the gelled films floated free from the glass (ca. 5 min.). The gel films were pinned on frames and first cured at 270° C. for 1/2 hour and then at 400° C. for 5 minutes.

Water absorptions were determined by placing strips of film in a 100% relative humidity chamber for 48 hours at room temperature. The film samples were subsequently analyzed for water content by thermal gravimetric analysis at 10° C./minute between a temperature range of 35° to 250° C.

Thermal expansion coefficients (CTE) were measured by placing strips of film (5 mm wide ×30 mm long) on quartz hooks in a Mettler thermal mechanical apparatus. A constant force of 0.005 Newton was imposed on the sample and the temperature was raised to 350° C. under nitrogen at a rate of 10° C./minute. The sample was allowed to cool while relaxed and the same heating conditions were applied again. The CTE was measured between 40° and 250° C.

The tensile modulus and elongation were measured using a Standard Instron testing apparatus and the values are the averages of three runs.

The results given in Table I show that the polyimides containing the chlorinated aromatic diamine as a monomer component had a lower water absorption and a higher modulus and elongation when compared to the identical polyimide not containing the chlorinated diamine monomer (Examples 1 to 4 and Comparative Examples 1C to 4C).

It was further surprising that the polyimide films containing the chlorinated diamine monomer were very flexible after the initial 270° C. cure whereas the films not containing the chlorinated monomer were very brittle. This property assures that the polyimide films of the invention will not fracture during the curing steps and the beads of film pinned on a frame will not become brittle and break away from the frame.

TABLE I

Properties of Homo- and Copolyimides Containing Chlorinated Aromatic Diamines

| Ex. No.[1] | Monomers (mole %)[2] | | | | | | | Modulus (Kpsi) | Elongation (%) | Tensile Strength (Kpsi) | CTE (ppm/°C.) | Water Absorption (%) | Processability @270° C. Cure |
|---|---|---|---|---|---|---|---|---|---|---|---|---|---|
| | PMDA | BPDA | BTDA | PPD | ODA | ClPPD | DClODA | | | | | | |
| 1 | 100 | 0 | 0 | 0 | 60 | 40 | 0 | 594 | 85 | 35 | 16 | 2.99 | Flexible |
| 1C | 100 | 0 | 0 | 40 | 60 | 0 | 0 | 463 | 28 | 20 | 21 | 3.76 | Brittle |
| 2 | 60 | 40 | 0 | 0 | 30 | 70 | 0 | 1136 | 39 | 47 | 16 | 2.05 | Flexible |
| 2C | 60 | 40 | 0 | 70 | 30 | 0 | 0 | 900 | 33 | 35 | 13 | 2.44 | Brittle |
| 3 | 0 | 100 | 0 | 0 | 0 | 100 | 0 | 1020 | 7 | 42 | 12 | 1.70 | Flexible |
| 3C | 0 | 100 | 0 | 100 | 0 | 0 | 0 | 1144 | 4 | 30 | 9 | 2.20 | Brittle |
| 4 | 100 | 0 | 0 | 0 | 0 | 0 | 100 | 539 | 34 | 33 | 21 | 2.26 | Flexible |
| 4C | 100 | 0 | 0 | 0 | 100 | 0 | 0 | 400 | 30 | 30 | 35 | 2.90 | Brittle |
| 5 | 70 | 0 | 30 | 0 | 35 | 65 | 0 | 975 | 16 | 36 | 14 | 2.87 | Flexible |
| 6 | 30 | 0 | 70 | 0 | 30 | 70 | 0 | 744 | 23 | 31 | 24 | 2.45 | Flexible |
| 7 | 72 | 0 | 28 | 0 | 30 | 70 | 0 | 991 | 7 | 36 | 11 | 3.32 | Flexible |
| 8 | 51 | 0 | 49 | 0 | 50 | 50 | 0 | 800 | 22 | 34 | 16 | 2.69 | Flexible |
| 9 | 31 | 0 | 69 | 0 | 70 | 30 | 0 | 600 | 43 | 31 | 17 | 2.62 | Flexible |

TABLE I-continued

Properties of Homo- and Copolyimides Containing Chlorinated Aromatic Diamines

| Ex. No.[1] | Monomers (mole %)[2] | | | | | | | Modulus (Kpsi) | Elongation (%) | Tensile Strength (Kpsi) | CTE (ppm/°C.) | Water Absorption (%) | Processability @270° C. Cure |
|---|---|---|---|---|---|---|---|---|---|---|---|---|---|
| | PMDA | BPDA | BTDA | PPD | ODA | ClPPD | DClODA | | | | | | |
| 10 | 70 | 0 | 30 | 0 | 70 | 30 | 0 | 529 | 68 | 31 | 31 | 2.41 | Flexible |

[1]"C" designates Comparative example not containing a chlorinated diamine as a monomer component.
[2]PMDA = pyromellitic dianhydride. BPDA = 3,3',4,4'-biphenyltetracarboxylic dianhydride; BTDA = 3,3',4,4'-benzophenonetetracarboxylic dianhydride; PPD = p-phenylene diamine; ODA = 4,4'-diaminodiphenyl ether; ClPPD = 2-chloro-p-phenylenediamine; DClODA = 2,2'-dichloro-4,4'-diaminodiphenyl ether.

What is claimed is:

1. An aromatic homopolyimide or copolyimide film having low water absorption and high thermal durability comprising an aromatic tetracarboxylic dianhydride component and an aromatic diamine component wherein said aromatic diamine component comprises from 30 to 100 mole %, based on the total molar amount of diamine present, of a chlorinated aromatic diamine selected from the group consisting of 2-chloro-p-phenylene diamine and 2,2'-dichloro-4,4'-diaminodiphenylether.

2. The aromatic homopolyimide film of claim 1 wherein the aromatic tetracarboxylic dianhydride component is pyromellitic dianhydride and the aromatic diamine component is 2-chloro-p-phenylenediamine.

3. The aromatic homopolyimide film of claim 1 wherein the aromatic tetracarboxylic dianhydride component is 3,3',4,4'-biphenyltetracarboxylic dianhydride and the aromatic diamine component is 2-chloro-p-phenylenediamine.

4. The aromatic homopolyimide film of claim 1 wherein the aromatic tetracarboxylic dianhydride is pyromellitic dianhydride and the aromatic diamine component is 2,2'-dichloro-4,4'-diaminodiphenylether.

5. The aromatic copolyimide film of claim 1 wherein, based on the total molar amount of dianhydride, from 25 to 75 mole % of an aromatic tetracarboxylic dianhydride component is present and based on the total amount of diamine, from 30 to 70 mole % of an aromatic diamine component is present and from 30 to 70 mole % of 2-chloro-p-phenylenediamine is present.

6. The aromatic copolyimide film of claim 1 wherein, based on the total molar amount of dianhydride, from 25 to 75 mole % of an aromatic tetracarboxylic dianhydride component is present and, based on the total molar amount of diamine, from 30 to 70 mole % of an aromatic diamine component is present, and from 30 to 70 mole % of 2,2'-dichloro-4,4'-diaminodiphenylether is present.

7. The aromatic copolyimide film of claim 5 wherein the aromatic tetracarboxylic dianhydride is selected from the group consisting of pyromellitic dianhydride, 3,3',4,4'-benzophenone tetracarboxylic dianhydride and the aromatic diamine is selected from the group nconsisting of p-phenylenediamine and 4,4'-diaminodiphenylether.

8. The aromatic copolyimide film of claim 6 wherein the aromatic tetracarboxylic dianhydride is selected from the group consisting of pyromellitic dianhydride, 3,3',4,4'-biphenyltetracarboxylic dianhydride, and 3,3',4,4'-benzophenone tetracarboxylic dianhydride and the aromatic diamine is selected from the group consisting of p-phenylene diamine and 4,4'-diaminodiphenyl ether.

9. The aromatic copolyimide film of claim 7 comprising pyromellitic dianhydride and, based on the total molar amount of diamine, 60 mole % of 4,4'-diaminodiphenylether and 40 mole % of 2-chloro-p-phenylene diamine.

10. The aromatic copolyimide film of claim 7 comprising, based on the total molar amount of dianhydride, 60 mole % of pyromellitic dianhydride and 40 mole % of 3,3',4,4'-biphenyltetracarboxylic dianhydride and, based on the total molar amount of diamine, 30 mole % of 4,4'-diaminodiphenylether and 70 mole % of 2-chloro-p-phenylenediamine.

11. The aromatic copolyimide film of claim 7 comprising, based on the total molar amount of dianhydride, 30 mole % of pyromellitic dianhydride and 70 mole % of 3,3',4,4'-benzophenone tetracarboxylic dianhydride and, based on the total molar amount of diamine, 30 mole % of 4,4'-diaminodiphenylether and 70 mole % of 2-chloro-p-phenylene diamine.

12. The aromatic copolyimide film of claim 7 comprising, based on the total molar amount of dianhydride, 50 mole % of pyromellitic dianhydride and 50 mole % of 3,3',4,4'-benzophenone tetracarboxylic dianhydride and, based on the total molar amount of diamine, 50 mole % of 4,4'-diaminodiphenyl ether and 50 mole % of 2-chloro-p-phenylene diamine.

13. The aromatic copolyimide film of claim 7 comprising, based on the total molar amount of dianhydride, 70 mole % of pyromellitic dianhydride and 30 mole % of 3,3',4,4'-benzophenone tetracarboxylic dianhydride and, based on the total molar amount of diamine, 70 mole % of 4,4'-diaminodiphenyl ether and 30 mole % of 2-chloro-p-phenylene diamine.

* * * * *